United States Patent [19]

Wang

[11] Patent Number: 5,893,744

[45] Date of Patent: Apr. 13, 1999

[54] METHOD OF FORMING A ZERO LAYER MARK FOR ALIGNMENT IN INTEGRATED CIRCUIT MANUFACTURING PROCESS EMPLOYING SHALLOW TRENCH ISOLATION

[76] Inventor: Larry Yu Wang, San Jose, Calif.

[21] Appl. No.: 08/789,255

[22] Filed: Jan. 28, 1997

[51] Int. Cl.[6] .................................................. H01L 21/76
[52] U.S. Cl. .......................... 438/401; 438/427; 438/734; 438/975
[58] Field of Search .............................. 438/401, 424, 438/427, 700, 734, 975, FOR 227, 251, 797

[56] References Cited

U.S. PATENT DOCUMENTS 4,737,468  4/1988  Martia .
5,157,003  10/1992  Tsuji et al. .
5,179,038  1/1993  Kinney et al. .
5,578,519  11/1996  Cho .
5,646,063  7/1997  Mehta et al. .
5,733,801  3/1998  Gojohbori .
5,817,568  10/1998  Chao .

*Primary Examiner*—George Fourson

[57] ABSTRACT

A method of forming an alignment mark in a wafer during the manufacture of shallow isolation trenches for semiconductor devices provides a nitride layer on a substrate prior to the formation of the alignment mark. Once the nitride layer has been formed, etching is performed to create the alignment mark in the substrate. Further processing steps of the shallow trench isolation technique do not require the depositing of nitride into the alignment mark. Since the alignment mark is etched only after the nitride layer has been deposited, no further nitride enters into the alignment mark and a nitride-free alignment mark is provided.

3 Claims, 9 Drawing Sheets

METHOD OF FORMING A ZERO LAYER MARK FOR ALIGNMENT IN INTEGRATED CIRCUIT MANUFACTURING PROCESS EMPLOYING SHALLOW TRENCH ISOLATION

TECHNICAL FIELD OF THE INVENTION

The present invention relates to the field of semiconductor wafer fabrication, and more particularly, to a method of forming alignment marks used in semiconductor wafer fabrication employing shallow trench isolation techniques.

BACKGROUND OF THE INVENTION

During semiconductor manufacturing processes, layers of various materials are deposited or grown on a wafer or die, one after the other. After many of the layers are deposited, lithographic processing techniques are used to transfer patterns to the surface layer or layers. In order for the finished product to operate properly, the pattern of each layer must be precisely aligned to the patterns of the other wafers on the layer, since misalignment of a layer with respect to a previous layer may be catastrophic to performance. One lithographic technique that is commonly used is a step-and-repeat pattern transfer system ("stepper") that involves imaging several exposures of portions of the wafer to cover an entire wafer surface.

To achieve perfect alignment, alignment marks are formed on the wafer and are used by the steppers, so that in each lithographic step, the mask will be properly aligned according to the marks in the previous layers before exposing the wafer. In typical systems, four marks are used, circumferentially distributed around the periphery of the wafer, although alignment can be made with fewer or greater than four marks, and can be placed on other parts of the wafer.

It is desirable for alignment marks to have sharp edges, and a depth that allows the mark to be recognized by the stepper in order to make the mark useful as an alignment tool. A typical depth of the mark required by conventional steppers manufactured by ASM Lithography is 1200 Å. Marks required by steppers by other stepper manufacturers may need a different mark depth. If the mark region has edges that are too close to one another, or if the mark contains material that is discolored, the wrong edge may be selected by the stepper so that misalignment will result. Alignment is particularly critical in processes for manufacturing extremely small devices, such as sub-micron devices. However, residual matter within a mark can blur the resolution of the mark and prevent this necessary accurate alignment. For example, residual nitride or other materials employed in semiconductor fabrication can remain near the edges or in the middle of the mark, and will detrimentally affect the ability of a stepper to align subsequent exposures with these marks.

A relatively recent technique for isolating an active region in a semiconductor chip is known as shallow trench isolation. In this technique, a shallow trench is formed around an active region to isolate this active region from other regions of the chip. Although shallow trench isolation has proven to be a valuable technique, the formation of marks in conjunction with the shallow trench isolation technique leaves residual material (e.g., nitride) within the marks. As stated earlier, the residual nitride in the marks interferes with proper working of the alignment system, causing frequent alignment failures and resultant reworks and scraps.

The formation of a mark according to the prior art in conjunction with a shallow trench isolation process is depicted in FIGS. 1–8, to illustrate the above-described problems with residual nitride. The placement of marks on a substrate is commonly performed before the implementation of the semiconductor devices, so that the location of the devices relative to the marks can be accurately controlled. In FIG. 1, semiconductor substrate 10 is cleaned, and an oxide layer 12 is grown or deposited on the semiconductor substrate 10 to approximately 150 Å. This oxide is needed to avoid subsequent photoresist process being directly applied on the Si substrate. Next, a photoresistive material (commonly called resist) 14 that is patterned by a lithographic process is spun on the oxide layer 12. The lithographic process transfers an alignment pattern on the resist 14, with the patterns being the openings 13 in the resist. The subsequent etching process (called zero layer etch) etches the oxide layer 12 and the substrate 10 in the open areas leaving the unopened areas untouched. The etching may be performed anisotropically, such as by a reactive ion etch (RIE) process, to form substantially orthogonal sidewalls, that is, sidewalls normal to both the plane of the substrate surface prior to the etch and normal to the bottom of the mark 16, as depicted in FIG. 2. The photoresistive mask 14 is then removed, leaving the oxide 12 and substrate 10 with a 1200 Å deep trench in the substrate 102. After etching, the oxide layer 12 is removed, leaving the resulting structure with a mark 16 in the substrate 10 depicted in FIG. 3. The mark 16 will then be used in subsequent processing steps in order to align the masks.

The following described steps, depicted in FIGS. 4–8, are performed in order to create a shallow isolation trench (typically 3000 Å deep). However, only the mark is depicted in FIGS. 4–8 in order to illustrate the effect of the shallow trench isolation manufacturing process on the mark 16.

From FIG. 3, an oxide layer 18 is thermally grown on the substrate 10. The oxide layer is approximately 150 Å thick, and covers the die surface, including the mark 16. The resulting structure is a semiconductor substrate 10 having a mark 16 with a depth of 1200 Å covered by a thin oxide layer 18 thickness of approximately 150 Å, as depicted in FIG. 4. This oxide is needed to avoid direct contact of the subsequent nitride deposition with Si substrate.

In FIG. 5, a nitride layer 20 ($Si_3N_4$) is deposited on the oxide layer 108 to a thickness of approximately 1700 Å. The nitride layer 20 settles into the mark 16 and a depression therefore forms in the nitride layer 20 over this mark 16.

A number of processing steps are then performed in order to create the shallow trenches, such as covering the nitride layer with a source/drain mask which is patterned by a lithographic process. The area over the mark 16 will be covered at this time. Etching is performed in the open areas of the mask to create the trenches around the active device regions as desired. Once the etches have been performed and the shallow trenches are created, the mask is removed from the nitride layer, once again leaving the structure of FIG. 5.

The next step in the shallow trench isolation process is the depositing of a TEOS layer 22 (tetraethyl orthosilane) with a depth of approximately 6200 Å on the nitride layer 20. The resulting structure in the region of the mark 16 is depicted in FIG. 6. The TEOS layer 22 is then etched with a planarization mask, so that areas on top of the nitride layer 20 are exposed except in the active device regions. The area over the mark 16 is exposed as well. The TEOS layer 22 is then removed with an etch. This removes most of the TEOS layer 22, as shown in FIG. 6a. Chemical mechanical planarization (CMP) is employed to remove the remainder of the TEOS layer 22, with the nitride layer 20 acting as a polish stop (FIG. 7). Because of the nature of the CMP process, the remainder of the TEOS on a flat surface can be completely polished away, those in the depressed mark regions cannot be consistently polished away, resulting in residual TEOS 22 within the depression in the nitride layer 20. This residual TEOS 22 creates a problem in the next step, which is the removal of the nitride layer 20.

Hot phosphoric acid is applied to remove the nitride layer 20. Although nearly all the nitride layer 20 is removed, the TEOS 22 that remained in the depression in the nitride layer 20 serves to prevent complete removal of the nitride layer 20 within the mark 16. As depicted in FIG. 8, the residual TEOS 22 effectively shields the nitride layer 20 underneath the residual TEOS 22. This creates structures, such as the columns of nitride 20 in FIG. 8. Other irregular shapes may arise as well, depending on the thickness and the extent of the residual TEOS 22. Nitride remaining within the mark 16 presents a discoloration that confuses a stepper trying to align on the mark 16. Also, the stepper is likely to have problems with determining the location of the edges 24 of the mark 16, due to the edges present on the columns 20 of the residual nitride within the mark 16.

As demonstrated above, the shallow trench isolation technique has a deleterious effect on alignment marks by causing nitride to remain within the alignment marks. This results in misalignment by the stepper and therefore lowers product yield.

SUMMARY OF THE INVENTION

There is a need for a method of forming an alignment mark in a semiconductor wafer that may be used for accurately aligning a stepper, even after a shallow trench isolation process is performed.

This and other needs are met by the present invention which provides a method of making alignment marks on a wafer during the manufacture of isolation trenches for semiconductor devices. This method comprises the steps of forming a nitride on a substrate, and etching the nitride and the substrate to form an alignment mark. The alignment mark is then masked and an isolation trench is created. The mask over the alignment mark is then removed.

The present invention avoids the residual nitride in the mark by creating the alignment mark only after the nitride is formed on the substrate. (In certain embodiments, the nitride is formed on an oxide which has been previously formed on the substrate.) Since the alignment mark is made only after the nitride layer has been formed during a shallow trench isolation process, once the alignment mark has been etched, no further nitride will be introduced into the mark. This is in contrast to the prior art in which the mark is formed prior to the formation of a nitride layer. Because the mark is already formed in the prior art, the formation of a nitride layer during a shallow trench isolation process causes nitride to be introduced into the already formed alignment mark. This introduces the possibility of residual nitride in the mark, which occurs due to the incomplete removal of the nitride from the mark as a result of the shielding by a TEOS layer.

The elegant technique of the present invention of forming the alignment mark only after the nitride has been formed during the shallow trench isolation process provides alignment marks that are free of nitride and easily recognizable by a stepper during the alignment process. Since precise alignment is possible for the stepper, the amount of reworks and scraps is greatly reduced.

Another advantage of the present invention is that the steps of growing and cleaning the first oxide layer is eliminated, thereby reducing the cost of manufacture.

The foregoing and other features, aspects and advantages of the present invention will become more apparent from the following detailed description of the present invention when taken in conjunction with the accompanying drawings.

DETAILED DESCRIPTION OF AN ILLUSTRATIVE EMBODIMENT

The present invention provides an improved method for forming an alignment mark in a semiconductor die wafer such that the alignment mark will not be corrupted by the formation of a shallow isolation trench. With the present invention, once a mark has been formed, the shallow trench isolation technique may continue to be performed as in the prior art.

Figure 1:
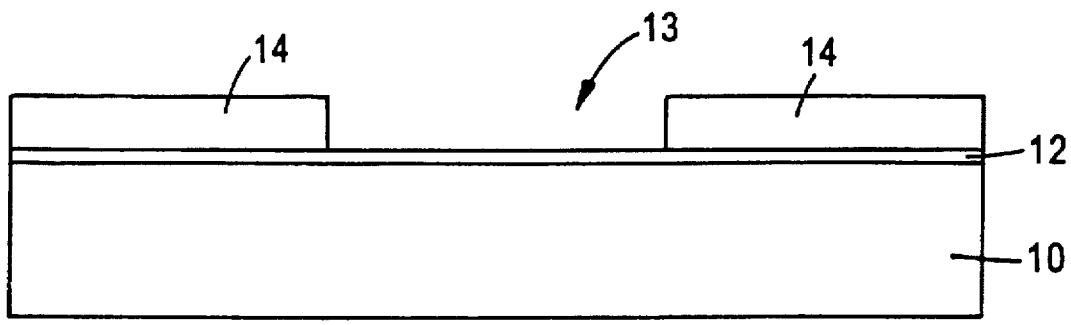
FIG. 1 is a cross-section of a semiconductor substrate in the area of a mark to be manufactured in accordance with the prior art.
Figure 2:
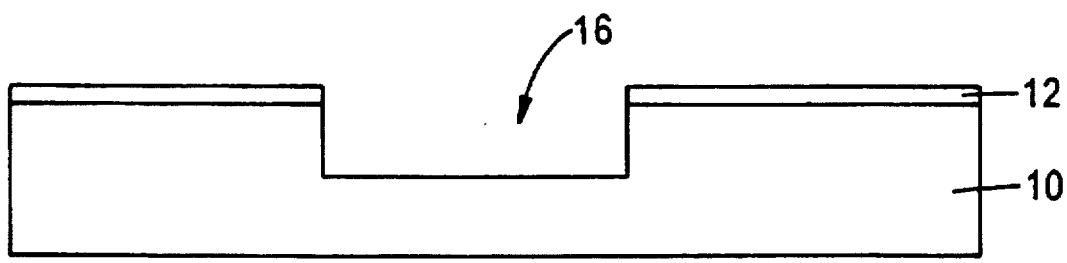
FIG. 2 depicts a semiconductor substrate in which a mark has been etched and after the removal of a photoresistive mask, in accordance with the prior art.
Figure 3:
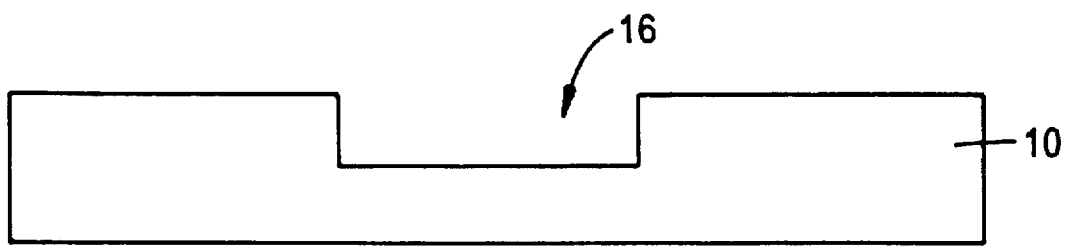
FIG. 3 is a cross-section of a mark constructed in accordance with the prior art, after the oxide has been removed.
Figure 4:
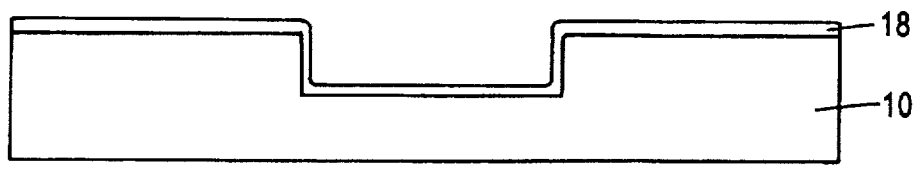
FIG. 4 is a cross-section of the mark after an oxide layer has been thermally grown or deposited thereon, in accordance with a shallow trench isolation manufacturing process of the prior art.
Figure 5:
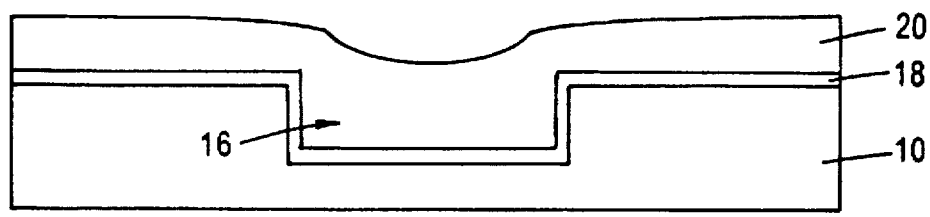
FIG. 5 is a depiction of a mark after a layer of nitride has been deposited thereon in accordance with the shallow trench isolation technique of the prior art.
Figure 6:
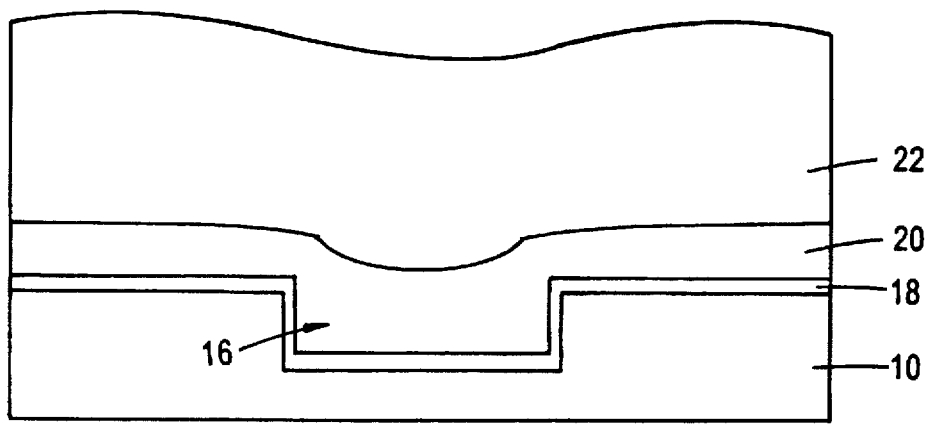
FIG. 6 is a depiction of the mark after a layer of tetraethyl orthosilane has been deposited on the nitride layer, in accordance with the shallow trench isolation technique of the prior art.
Figure 6A:
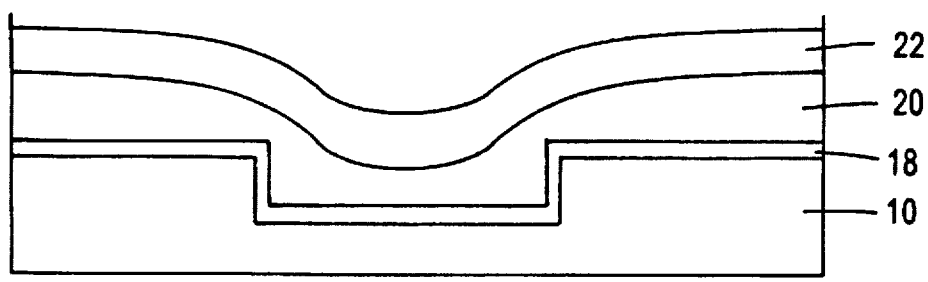
FIG. 6a is a depiction of the mark after an etch process to reduce the previously deposited TEOS thickness, in accordance with the shallow trench isolation technique of the prior art.
Figure 7:
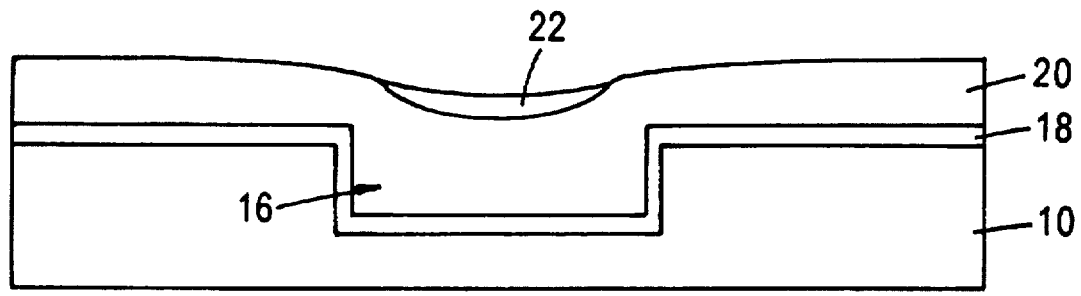
FIG. 7 is a depiction of the mark following removal of the TEOS layer by chemical mechanical planarization according to the prior art.
Figure 8:
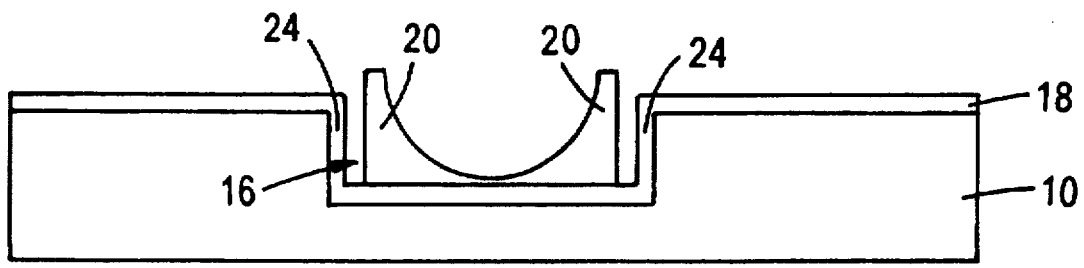
FIG. 8 is a depiction of the mark, according to the prior art, after a nitride strip has been performed.
Figure 9:
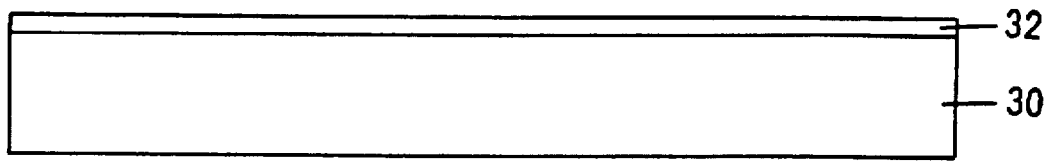
FIG. 9 is a cross-section of a semiconductor die wafer including a mark area and a device area after an oxide layer has been grown.

FIG. 9 is a schematic cross-section of a portion of a semiconductor die wafer. In each of FIGS. 9 through 23, the area of the mark for alignment is on the left-hand side of the figure, while the area of an active device to be formed or the shallow trench is depicted on the right-hand side of each figure. It will be understood by those of ordinary skill in the art that the relative sizes and depths depicted in the figures are merely for illustration and explanatory purposes and are not limiting in any respect.

Figure 10:
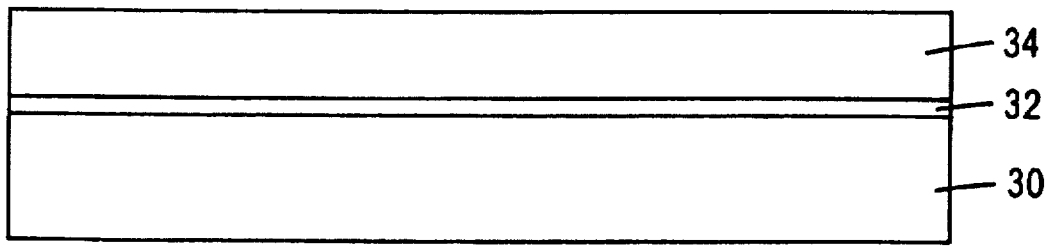
FIG. 10 is a cross-section of the semiconductor die wafer after a nitride layer has been deposited on the oxide layer, in accordance with the present invention.

In FIG. 9, a silicon substrate 30 of a semiconductor die wafer is depicted, on which an oxide layer 32 has been grown to a thickness of, for example, 150 Å. A layer of silicon nitride 34 is then deposited on the oxide layer 32, as depicted in FIG. 10. The thickness of the nitride layer 34 may be 1700 Å, for example. The nitride layer 34 serves as a polish stop for a subsequent polish step in a shallow trench isolation formation as will be described later.

Figure 11:
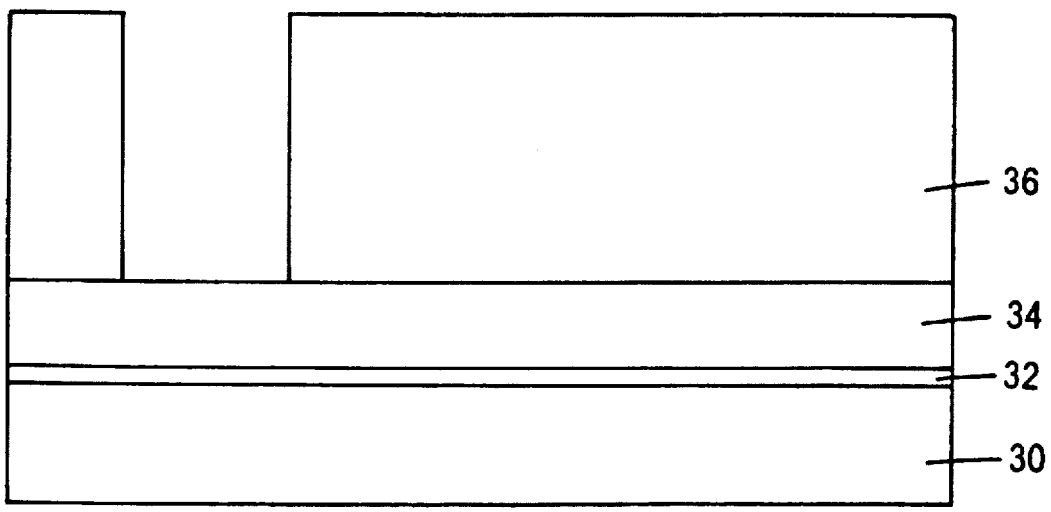
FIG. 11 is a cross-section of the semiconductor die wafer of FIG. 10, after a photolithography process has been performed on the nitride layer.

In FIG. 11, a photoresistive mask 36 to define alignment marks has been applied on the nitride layer 34. In this step of the process, the device areas are completely masked off by the mask layer 36, while the area in which the mark is to be formed is exposed.

Figure 12:
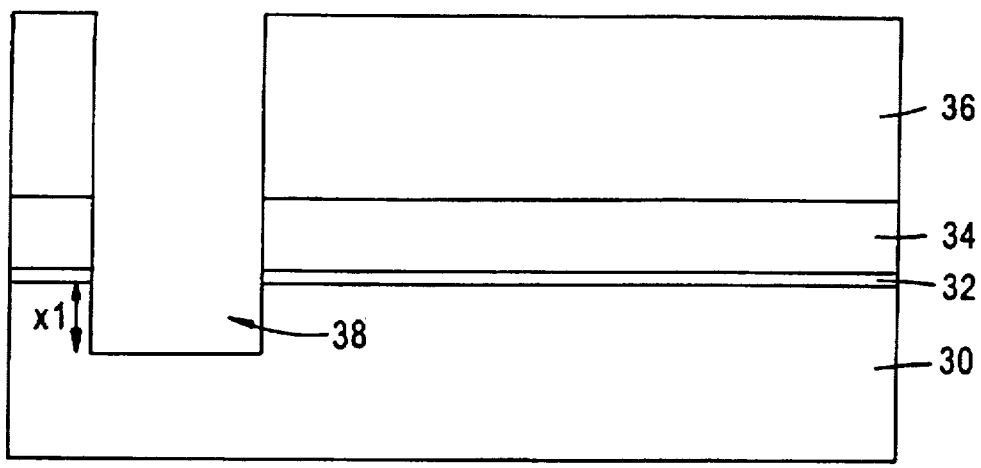
FIG. 12 is a cross-section of the semiconductor die wafer of FIG. 11, after an etching has been performed in accordance with the present invention.

FIG. 12 depicts the semiconductor die wafer after an etching has been performed. In preferred embodiments, an anisotropic etch, such as a reactive ion etch (RIE) process is performed. The anisotropic etch forms substantially orthogonal sidewalls, that is, sidewalls normal to both the plane of the substrate surface prior to the etch and normal to the bottom of the opening. The etch through the mask layer 36 etches the nitride layer 34, the oxide layer 32, into the substrate 30. In the exemplary embodiment, the depth X1 of the etch from the top surface of the substrate 30 is approximately X1=980 Å.

Figure 13:
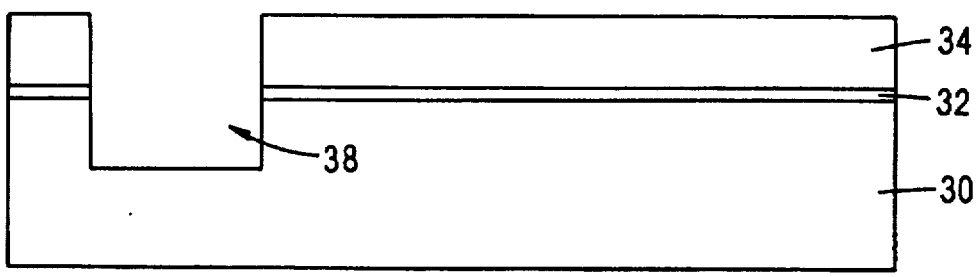
FIG. 13 is a cross-section of a semiconductor die wafer of FIG. 12, after the photoresistive mask has been removed from the nitride layer.

FIG. 13 depicts the semiconductor die wafer after the mask layer 36 has been removed. At this point, the alignment mark 38 has been essentially formed. The process continues in order to form the shallow trench in the device area.

Figure 14:
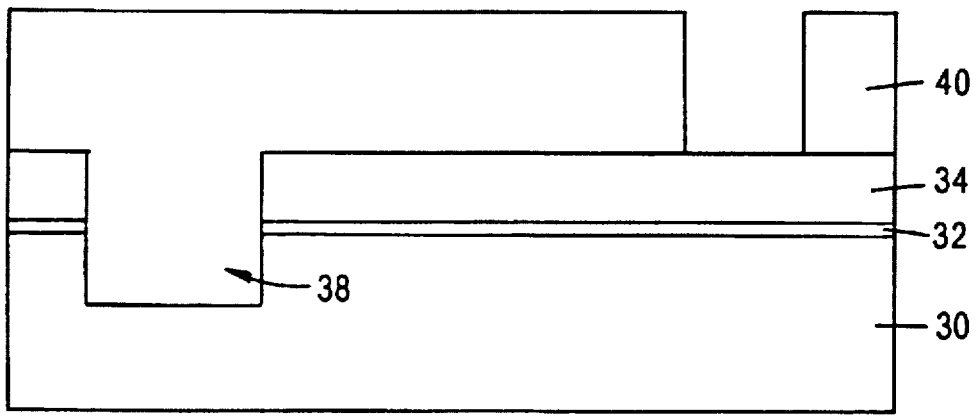
FIG. 14 is a cross-section of the semiconductor die wafer of FIG. 13, after another mask layer has been deposited on the nitride layer, in accordance with the present invention.
Figure 15:
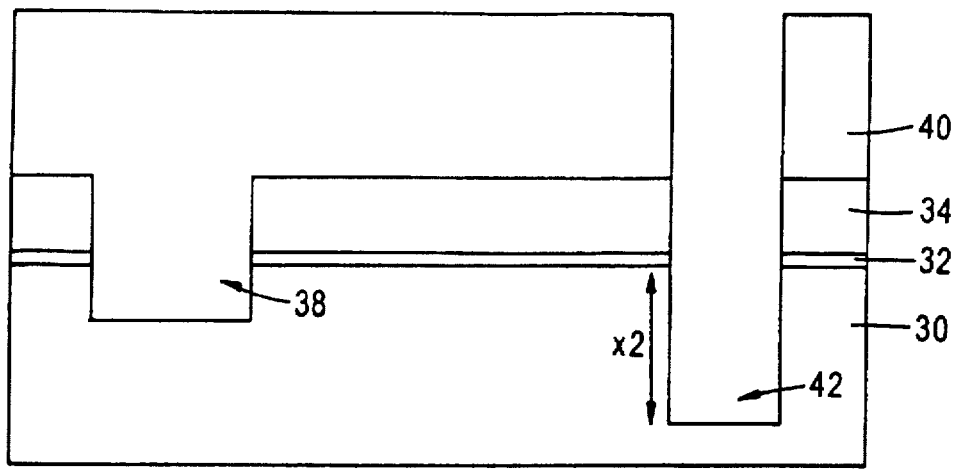
FIG. 15 is a cross-section of the semiconductor die wafer of FIG. 14, after an etching has been performed in accordance with an embodiment of the present invention.

In FIG. 14, a second mask layer 40 is applied over the nitride layer 34. The mask layer 40 completely covers the alignment mark 38, but exposes the area where the shallow trench for isolating active devices will be provided. This mask is the source/drain mask that will define the active area and the field mask. Etching is then performed anisotropically in order to form the shallow isolation trench 42 in substrate 30. This etching process etches through the nitride layer 34, the oxide 32, and into the substrate 30 to a depth X2 of approximately 3000 Å. Since the alignment mark 38 is covered by the mask layer 40, it is not affected by this etching.

Figure 16:
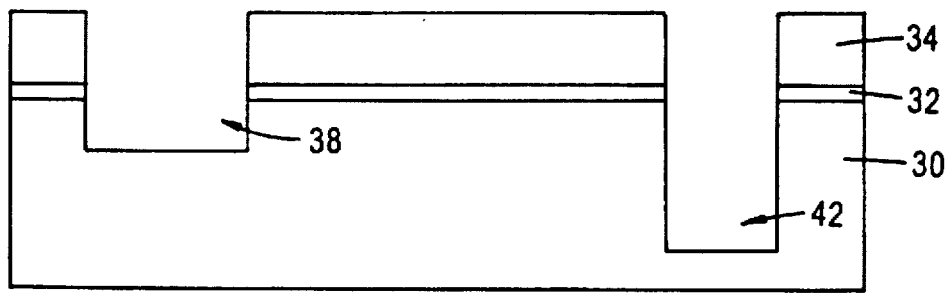
FIG. 16 is a cross-section of the semiconductor die wafer of FIG. 15, after the mask layer has been removed from the nitride layer.
Figure 17:
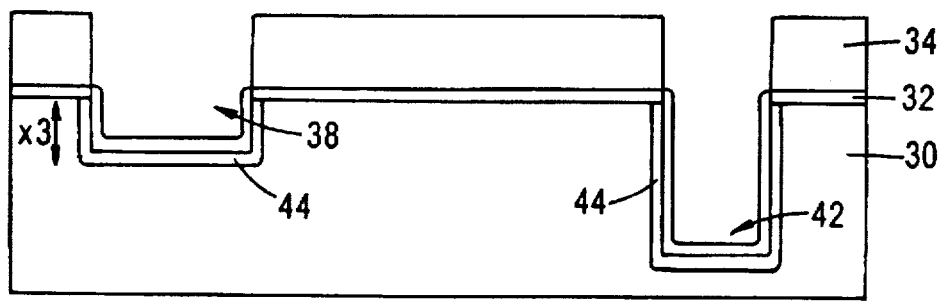
FIG. 17 is a cross-section of the semiconductor die wafer of FIG. 15, after a liner oxide has been grown on the mark and the trench, in accordance with an embodiment of the present invention.

FIG. 16 depicts the semiconductor die wafer after the photoresistive mask (i.e., the source/drain mask) has been removed and cleaned from the nitride layer 34. The next step in the process, according to the present invention, is the growth of liner oxide 44 into the alignment mark 38 and isolation trench 42. The liner oxide 44 is grown to approximately 500 Å. Approximately 45% of the liner oxide 44 grows into the substrate 30. This has the effect of extending the depth of the alignment mark from 980 Å to the 1200 Å depth (X3) required by certain conventional steppers and other machines that rely on the alignment marks. The liner oxide 44 is transparent to the stepper or other alignment-checking devices. Accordingly, since the liner oxide step in the shallow trench isolation manufacturing process is used, the depth of the alignment mark 38 as originally etched must be less than the required depth 1200 Å in order to account for the increased depth of the mark created by the liner oxide.

Figure 18:
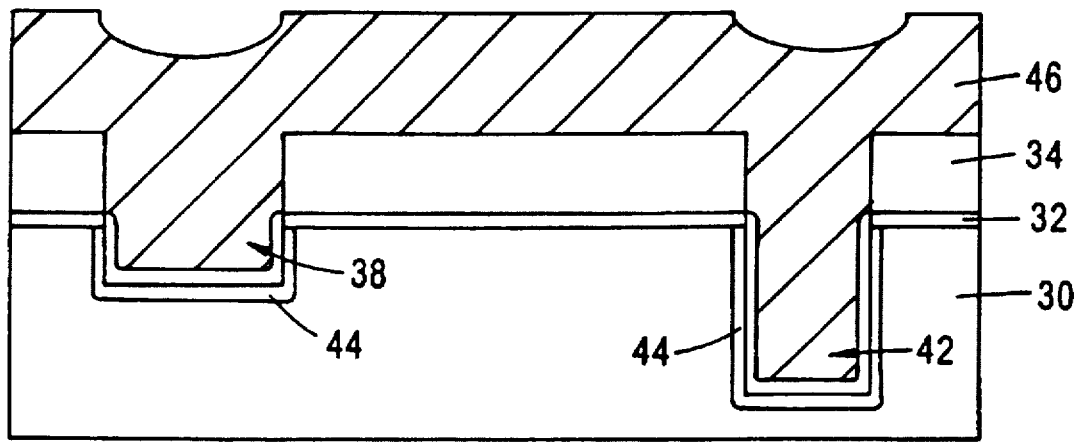
FIG. 18 is a cross-section of the semiconductor die wafer of FIG. 17, after tetraethyl orthosilane has been deposited on the nitride layer and within the trench and the mark respectively.

In FIG. 18, after the photoresistive mask 40 has been removed and the liner oxide 44 has been formed, a conformal layer of TEOS (tetraethyl orthosilane) 46 is deposited over the entire structure to a depth of approximately 6200 Å over the nitride layer 34 and into the alignment mark 38 and the isolation trench 44.

Figure 19:
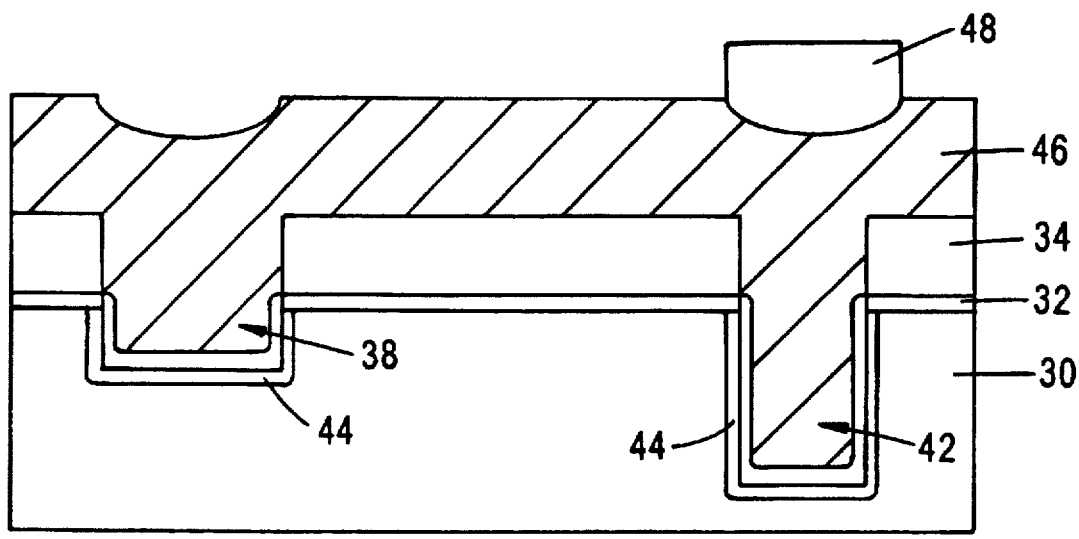
FIG. 19 is a cross-section of the semiconductor die wafer of FIG. 18, after a planarization mask has been applied, in accordance with the present invention.
Figure 20:
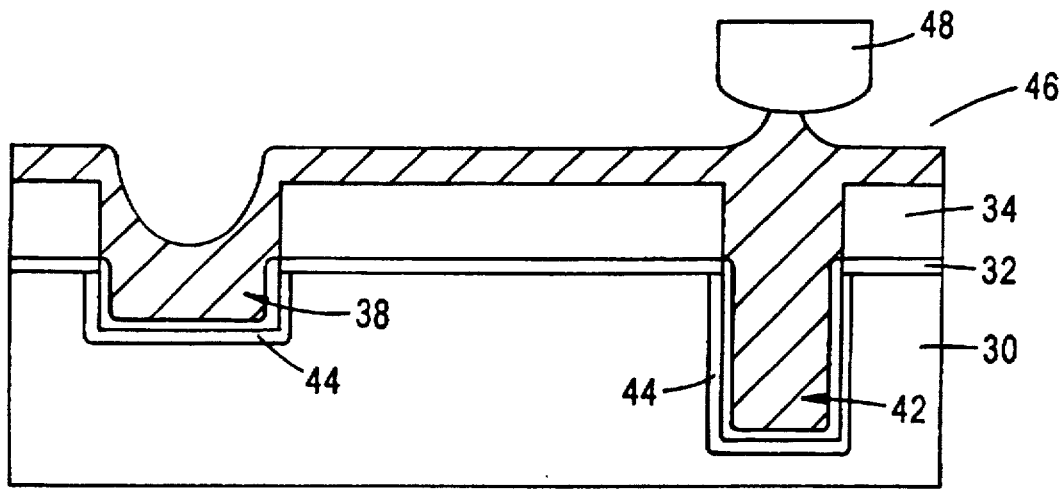
FIG. 20 is a cross-section of the semiconductor die wafer of FIG. 19, after etching of exposed portions of the TEOS layer through the mask layer.

In FIG. 19, a planarization mask 48 is applied over the TEOS layer 46. This planarization mask is a reverse of the active mask to open up areas on the top of the nitride layer 34. In this mask, the alignment mark area is exposed. An isotropic etching is performed to remove high areas of the TEOS layer 46 through the mask 48, as depicted in FIG. 20. Thus, the exposed portions of the conformal TEOS layer 46 are etched down to the level of the unexposed portions of the TEOS layer 46. The wet etch may be, for example, a buffered oxide etch comprising an aqueous solution of 40 parts ammonium fluoride ($NH_4F$) and one part hydrofluoric acid (HF).

The isotropic-type etch, such as the wet etch, will undercut the photoresist mask portions 48, and is preferred since there will be less oxide remaining in the raised portions adjacent to the edges of the photoresist mask 48. This in turn, simplifies the subsequent removal of the raised portions.

Figure 21:
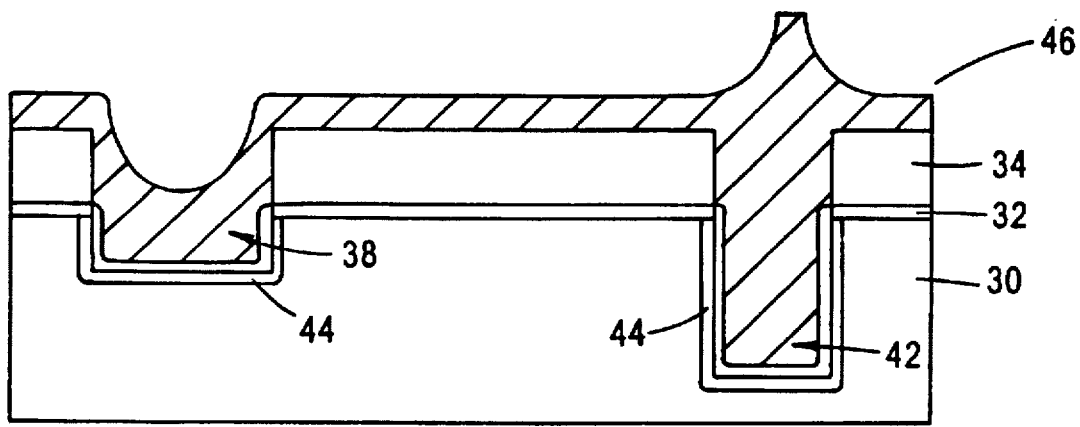
FIG. 21 is a cross-sectional view of the semiconductor die wafer of FIG. 20, after the mask layer has been removed.
Figure 22:
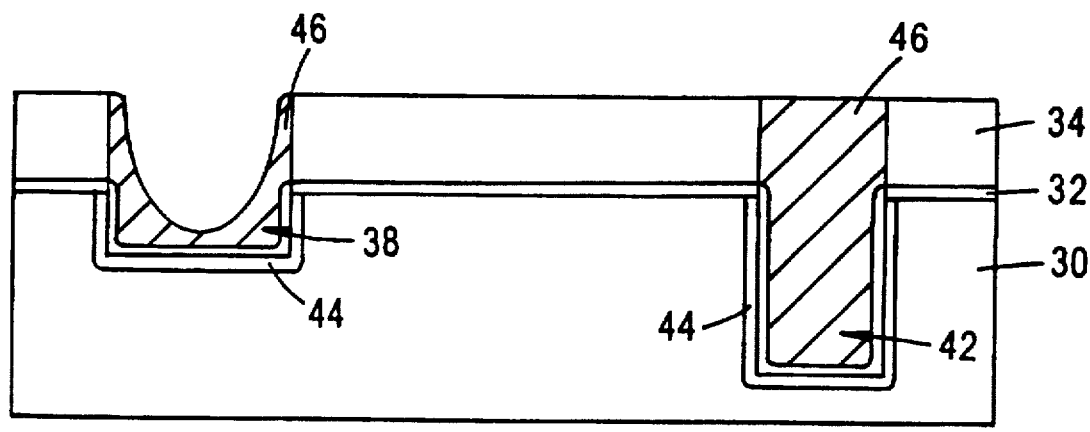
FIG. 22 is a cross-section of the semiconductor die wafer of FIG. 21, after chemical mechanical planarization of the TEOS layer to the nitride layer.
Figure 23:
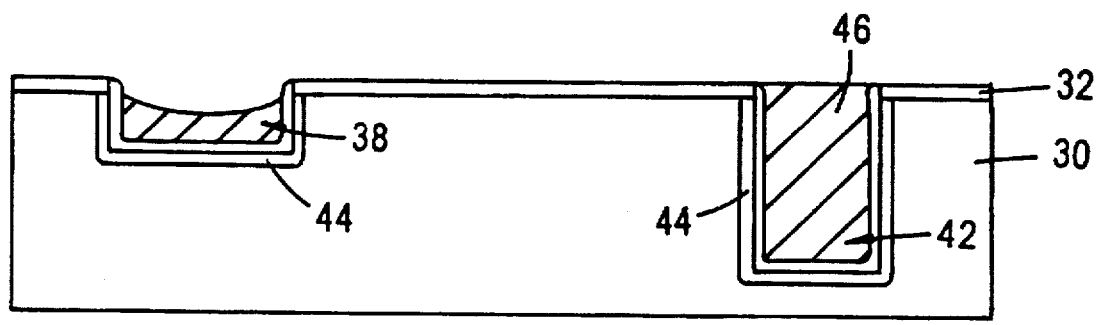
FIG. 23 is a cross-section of the semiconductor die wafer of FIG. 22, after the nitride layer has been removed by an etching process, in accordance with the present invention.

After etching, the mask layer is removed, as seen in FIG. 21. Chemical mechanical planarization (CMP) is then performed to provide a global planarization. This removes any TEOS material remaining on the nitride layer 34. The nitride layer 34 acts as a polish stop for the CMP process. A polish stop is desirable, since the CMP process is relatively imprecise and polishing down to the level of the substrate 30 would have catastrophic consequences for the semiconductor die wafer. After polishing, the semiconductor die wafer has a structure such as that shown in FIG. 22. The nitride layer 34 is then removed using hot phosphoric acid. This results in the structure of FIG. 23 with an alignment mark 38 free of nitride residue, and a shallow isolation trench 42 of a depth that provides the required isolation.

As can be seen from the above description, the present invention provides alignment marks that are free from nitride residue by etching these marks only after a nitride layer has been formed during the shallow trench isolation process. Once the alignment mark has been formed, no further nitride depositing steps are performed in the shallow trench isolation process, so that corruption of the formed alignment mark will not occur. The residual oxide 38 inside the marks is transparent to the alignment system, and therefore does not cause any alignment problem. Using the nitride-free alignment marks formed according to the present invention, precise alignment of masks during subsequent processing of the semiconductor die wafer is available.

Although the present invention has been described and illustrated in detail, it needs to be clearly understood that the same is by way of illustration and example only and is not to be taken by way of limitation, the spirit and scope of the present invention being limited only by the terms of the appended claims.

What is claimed is:

1. A method for forming an alignment mark and an isolation trench on a common wafer, the method comprising the steps of:

growing a layer of oxide on a semiconductor substrate;

depositing a nitride layer on top of the oxide;

masking the wafer with a mask having an exposed alignment mark area;

etching the nitride layer, the oxide and the substrate through the exposed alignment mark area to form the alignment mark; and forming an isolation trench in the wafer including the steps of masking the wafer to expose the area of the isolation trench and masking the alignment mark area, and etching the nitride layer and the substrate through the exposed isolation trench area to form the isolation trench.

2. The method of claim 1, further comprising growing liner oxide in the alignment mark and the isolation trench, the alignment mark having an initial depth prior to the growing of the liner oxide, and a final effective depth greater than the initial depth, after the growth of the liner oxide.

3. The method of claim 2, wherein the step of forming an isolation trench includes depositing a conformal oxide layer on the nitride layer after the isolation trench has been formed, the oxide layer filling the isolation trench and the alignment mark; masking the isolation trench area; substantially removing the oxide layer except for within the isolation trench; and removing the nitride layer.

* * * * *